United States Patent
Seo

(10) Patent No.: US 10,557,882 B2
(45) Date of Patent: Feb. 11, 2020

(54) APPARATUS AND METHOD FOR SENSING EVENT IN SMART PLUG DEVICE

(71) Applicant: Samsung Electronics Co., Ltd., Suwon-si, Gyeonggi-do (KR)

(72) Inventor: Sung-Mok Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 758 days.

(21) Appl. No.: 15/036,651

(22) PCT Filed: Nov. 13, 2014

(86) PCT No.: PCT/KR2014/010932
§ 371 (c)(1),
(2) Date: May 13, 2016

(87) PCT Pub. No.: WO2015/072771
PCT Pub. Date: May 21, 2015

(65) Prior Publication Data
US 2016/0327598 A1    Nov. 10, 2016

(30) Foreign Application Priority Data
Nov. 13, 2013 (KR) .......................... 10-2013-0137568

(51) Int. Cl.
*G01R 31/02* (2006.01)
*G01R 21/133* (2006.01)
(Continued)

(52) U.S. Cl.
CPC ........... *G01R 31/02* (2013.01); *G01R 19/165* (2013.01); *G01R 21/00* (2013.01); *G01R 21/133* (2013.01)

(58) Field of Classification Search
CPC .... G01R 19/165; G01R 21/00; G01R 21/133; G01R 31/02; G01R 31/44
See application file for complete search history.

(56) References Cited

U.S. PATENT DOCUMENTS

| | | | | |
|---|---|---|---|---|
| 5,497,332 A | * | 3/1996 | Allen ..................... | G01R 19/25 700/295 |
| 6,397,157 B1 | * | 5/2002 | Hogle ................ | G01R 19/2513 324/107 |

(Continued)

FOREIGN PATENT DOCUMENTS

| CN | 102087319 A | 6/2011 |
|---|---|---|
| CN | 103346444 A | 10/2013 |

(Continued)

OTHER PUBLICATIONS

Translation of KR1020120133922.*

*Primary Examiner* — Huy Q Phan
*Assistant Examiner* — Adam S Clarke
(74) *Attorney, Agent, or Firm* — Jefferson IP Law, LLP

(57) ABSTRACT

The present invention relates to an apparatus and a method for sensing an event occurring from a target device in a smart plug installed on a supply route of power applied to the target device. To this end, a power measurement unit which comprises the smart plug measures power supplied to the target device, and an event determination unit predicts an event occurring from the target device on the basis of a power signal characteristic of the supplied power measured by the power measurement unit. The power signal characteristic indicates a variation characteristic of the supplied power caused by the occurrence of the event on the basis of supplied power before the event occurs from the target device.

18 Claims, 10 Drawing Sheets

(51) Int. Cl.
*G01R 19/165* (2006.01)
*G01R 21/00* (2006.01)

(56) References Cited

U.S. PATENT DOCUMENTS

| | | | | |
|---|---|---|---|---|
| 2010/0109619 | A1* | 5/2010 | Tsou | H02J 3/14 |
| | | | | 323/234 |
| 2011/0068772 | A1 | 3/2011 | Kim et al. | |
| 2011/0210712 | A1* | 9/2011 | Tagare | H02M 1/083 |
| | | | | 323/284 |
| 2013/0176649 | A1* | 7/2013 | Wallis | H02H 5/041 |
| | | | | 361/24 |
| 2013/0245972 | A1* | 9/2013 | Imai | G01R 19/2513 |
| | | | | 702/60 |
| 2014/0248802 | A1* | 9/2014 | Hieda | H04L 12/2818 |
| | | | | 439/620.01 |
| 2014/0268473 | A1* | 9/2014 | Hassan-Ali | B60L 11/1818 |
| | | | | 361/179 |
| 2015/0057825 | A1* | 2/2015 | Steele | H02J 4/00 |
| | | | | 700/297 |

FOREIGN PATENT DOCUMENTS

| | | |
|---|---|---|
| EP | 2369353 A2 | 9/2011 |
| JP | 2003-228784 A | 8/2003 |
| JP | 2005-020230 A | 1/2005 |
| JP | 2006-311771 A | 11/2006 |
| KR | 10-2011-0031578 A | 3/2011 |
| KR | 10-2012-0133922 A | 12/2012 |
| KR | 10-2013-0018062 A | 2/2013 |
| KR | 10-2013-0048358 A | 5/2013 |

* cited by examiner

APPARATUS AND METHOD FOR SENSING EVENT IN SMART PLUG DEVICE

PRIORITY

This application is a National Phase Entry of PCT International Application No. PCT/KR2014/010932, which was filed on Nov. 13, 2014, and claims a priority to Korean Patent Application No. 10-2013-0137568, which was filed on Nov. 13, 2013, the contents of which are incorporated herein by reference.

DETAILED DESCRIPTION OF THE INVENTION

Technical Field

The present disclosure relates to an apparatus and method for detecting an event occurring in a target device by a smart plug installed on a supply route of power applied to the target device.

Background Art

A home network system supports interworking between home electronic products based on a variety of short-range wireless communication technologies.

Due to the development of smart devices capable of exchanging information with other devices using the communication function, the home network system has evolved into a smart home network system capable of collecting information about component devices. It is possible for the smart home network system to provide a new value, owing to the interworking between smart devices.

However, since the smart devices widely used at home include just the television or so, it is not free to expand the usage scenario of the smart home network system. As a result, there is a need for the ideas that can be used in a 'home automation system' utilizing the legacy products, which is in an earlier stage of the smart home network system.

The home automation system supports a monitoring function and a control function, as its basic functions. The home automation system may be built by using legacy devices. At least one sensor may be attached or installed to/on the legacy devices used to build the home automation system. The legacy device may monitor an individual operation of an adjacent legacy device, using the at least one attached or installed sensor. The legacy device may transfer information generated by detection of the adjacent legacy device to an information collection device provided on the outside. As a result, the legacy device may interwork with the device provided on the outside. The information collection device may provide the information collected from a plurality of legacy devices to the user or the third parties.

For example, an additional sensor may be installed on the refrigerator door and open/close of the refrigerator door may be monitored through the installed additional sensor, to provide the information collected by the monitoring to the user.

As described above, in order to monitor various events (detailed operations) occurring in each legacy device constituting the home automation system, it is necessary to attach or install individual sensors suitable to monitor the features of the events.

DISCLOSURE

Technical Problem

In order for the home automation system to monitor an event occurring in each legacy device, individual sensors should be attached or installed. However, in order to increase the utilization of the home automation system, it is necessary to increase the utilization such as monitoring an event occurring in each legacy device, without the addition of the sensors.

An embodiment to be offered in the present disclosure provides a smart plug that monitors an event occurring in an electronic device receiving the operating power supplied from the outside, without addition or installation of additional sensors.

Further, an embodiment to be offered in the present disclosure provides a smart plug that monitors an event occurring in an electronic device receiving the operating power supplied from the outside, regardless of the features of the device such as the type, model and capacity.

Further, an embodiment to be offered in the present disclosure provides an apparatus and method for recognizing occurrence of an event for an operation of a target device in a smart plug installed on a route supplying power to the target device.

Further, an embodiment to be offered in the present disclosure provides an apparatus and method for predicting, by a smart plug, occurrence of an event in a target device by monitoring a change in power supplied to the target device.

Further, an embodiment to be offered in the present disclosure provides an apparatus and method for monitoring, by a smart plug, occurrence of an event in a target device based on the power signal characteristic of power supplied to the target device.

Further, an embodiment to be offered in the present disclosure provides an apparatus and method for monitoring, by a smart plug, occurrence of an event in a target device by utilizing a power factor defining a ratio of real power to apparent power of the target device.

Further, an embodiment to be offered in the present disclosure provides an apparatus and method for setting, by a smart plug, at least one threshold for recognizing occurrence of the same event, when a target device operates in a specific operation mode and does not operate in the specific operation mode.

Technical Solution

In accordance with an aspect of exemplary embodiments of the present disclosure, there is provided a smart plug device installed on a power supply route to a target device to detect an event occurring in the target device. The device includes a power measurement unit configured to measure power supplied to the target device; and an event determination unit configured to predict an event occurring in the target device based on a power signal characteristic of the supplied power measured by the power measurement unit. The power signal characteristic represents a change characteristic of the supplied power caused by the occurrence of the event based on the supplied power before the event occurs in the target device.

In accordance with another aspect of exemplary embodiments of the present disclosure, there is provided a method for detecting an event occurring in a target device by a smart plug device installed on a power supply route to the target device. The method includes measuring power supplied to the target device; and predicting an event occurring in the target device based on a power signal characteristic of the measured supplied power. The power signal characteristic represents a change characteristic of the supplied power caused by the occurrence of the event based on the supplied power before the event occurs in the target device.

Advantageous Effects

The present disclosure can make it possible to recognize an event occurring in a target device by monitoring power consumption of the target device using a smart plug, without installation of an additional sensor. In addition, the present disclosure provides the compatibility capable of monitoring an event occurring in all electronic devices regardless of the type, model and capacity of the target device.

Other effects that can be obtained or estimated by an embodiment of the present disclosure will be disclosed directly or implicitly in a detailed description of an embodiment of the present disclosure. In other words, various effects estimated according to an embodiment of the present disclosure will be disclosed in the following detailed description.

BEST MODE

Figure 1:
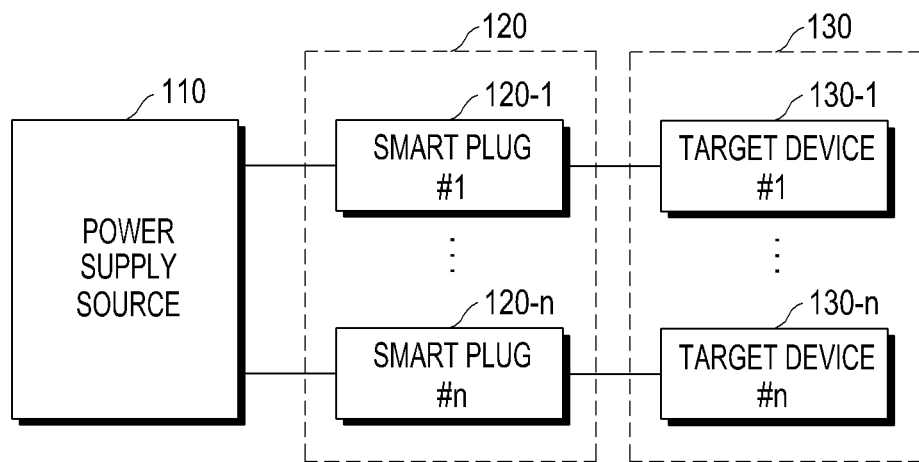
FIG. 1 shows exemplary installation of smart plugs according to an embodiment of the present disclosure.

A representative embodiment for accomplishing the above-described technical tasks will be disclosed in the following detailed description. The names of entities defined for the convenience of the description may be used in the same way in the detailed description. However, the names used for the convenience of the description are not to limit the rights. Of course, the same or simple changes thereof may be applied to the system having the similar technical background.

In addition, if it is determined that a detailed description of the known functions or configurations may unnecessarily obscure the proposed technical points in the following detailed description, the detailed description will be omitted.

Various embodiments to be described below will suggest a way to detect an event occurring in a target device using thresholds set by a smart plug installed between a power supply source and the target device operating by the supplied power. The thresholds may be used to detect an event by detecting a change in the power consumption due to the occurrence of an event. The thresholds may include at least one positive threshold and at least one negative threshold. The at least one positive threshold is a threshold that is set to detect an increase in the power consumption due to the occurrence of an event. The at least one negative threshold is a threshold that is set to detect a decrease in the power consumption due to the occurrence of an event.

Even for the same event, the increase or decrease in the power consumption may be different depending on the operation state of the target device. In this case, it is possible to set at least one positive threshold and at least one negative threshold for each operation state of the target device.

For example, it is possible to define a positive power detection interval for recognizing the power consumption that increases due to the occurrence of a specific event regardless of the operation state of the target device. The positive power detection interval may be set by one positive high threshold (hereinafter, referred to as "first high threshold") and one positive low threshold (hereinafter, referred to as "first low threshold"). In this case, the positive power detection interval may be set by an interval between one first high threshold and one first low threshold.

It is possible to define a negative power detection interval for recognizing the power consumption that decreases due to the occurrence of a specific event regardless of the operation state of the target device. The negative power detection interval may be set by one negative high threshold (hereinafter, referred to as "second high threshold") and one negative low threshold (hereinafter, referred to as "second low threshold"). In this case, the negative power detection interval may be set by an interval between one second high threshold and one second low threshold.

The first high threshold and the second high threshold may be set based on a difference between real power and a bias of the real power at the time that an event occurs while a specific operation is not being performed in the target device. The first low threshold and the second low threshold may be set based on the biggest noise value or the average noise value after storing positive noises and negative noises occurring for a predetermined time and removing a predetermined outlier in the order of the large absolute value of the stored noises while a specific operation is being performed in the target device.

In the following detailed description, an exemplary embodiment will be proposed, in which a smart plug is configured to determine occurrence/non-occurrence of an event using a power factor and preset thresholds. The power factor may be defined by a ratio of real power to apparent power, at which the smart plug monitors the amount of power supplied from the power supply source to the target device, and which is identified through the monitoring.

Embodiments to be offered in the present disclosure will be described below in detail with reference to the accompanying drawings.

FIG. 1 shows exemplary installation of smart plugs according to an embodiment of the present disclosure.

Referring to FIG. 1, a smart plug module 120 may include one or a plurality of smart plugs 120-1 to 120-n. The number of smart plugs constituting the smart plug module 120 may be determined as the number (or more) of target devices receiving the operating power supplied from a power supply source 110. For example, the smart plug module 120 may be installed to bind the outlet mounted on the wall with the power cords of the target devices 130.

For the one or a plurality of smart plugs 120-1 to 120-n, each or some of them, not one module, may be configured independently. In the following description, it is assumed that each of the one or a plurality of smart plugs 120-1 to 120-n is installed independently. However, the proposed embodiments may not be necessarily applied to the independently installed smart plugs.

Each of the plurality of smart plugs 120-1 to 120-n is installed on a route via which the operating power is supplied to the target devices 130-1 to 130-n by the power supply source 110. In other words, the smart plug #1 120-1 is located on a route via which the power is supplied to the target device #1 130-1 by the power supply source 110, and the smart plug #n 120-n is located on a route via which the power is supplied to the target device #n 130-n by the power supply source 110. For example, each of the smart plugs 120-1 to 120-n may be installed to bind the outlet mounted on the wall with the power cord for each of the target devices 130-1 to 130-n. The outlet mounted on the wall may be the power supply source 110.

The target devices 130-1 to 130-n may use, as the operating power, the power that is supplied from the power supply source 110 through the smart plugs 120-1 to 120-n. In the following description, a smart plug 120 will be used to represent each of the smart plugs 120-1 to 120-n, and a target device 130 will be used to represent each of the target devices 130-1 to 130-n.

The smart plug 120 is designed to monitor and control the power consumption of individual appliances, i.e., the target device 130. The smart plug 120 may set thresholds using the power profile obtained by analyzing the power consumed in the target device 130. The thresholds will be used for monitoring a specific event occurring in the target device 130. The power profile may be defined for each type of the target device. Even if the target device is the same type of device, the power profile may be independently defined considering the difference in the brand and the capacity. The reason is because a change in real power may be different depending on the type, brand and capacity of the target device. The expression that the change in real power is different means that the characteristic of the power profile may be different.

The smart plug 120 monitors the occurrence of a specific event in the target device 130. For example, the smart plug 120 may monitor the occurrence of a specific event based on an index (e.g., a power factor) indicating a change in supplied power, and preset thresholds. In order to obtain an index indicating a change in supplied power, the smart plug 120 may monitor the power supplied to the target device 130. The smart plug 120 may monitor the occurrence of a specific event in the target device 130, without requiring installation of a separate sensor.

The specific event may be an event for the operation provided by the target device 130. For example, the specific event may be open/close of a refrigerator door, switching of the TV channel, the current operating state (washing, rising, dehydration, etc.) of the washing machine, and clogging of the vacuum cleaner.

In the preferred embodiment to be described below, an example of an operation for detecting occurrence/non-occurrence of an event for the open/close of the refrigerator door will be considered. The smart plug detects the open or close of the refrigerator door using the pre-designed power profile for the refrigerator. In this case, it would be preferable to create the power profile, given that the change in real power may be different depending on the brand and capacity of the refrigerator. This can be utilized for determining the safety of elderly people living alone, and managing the regular eating habits thereof.

Figure 2:
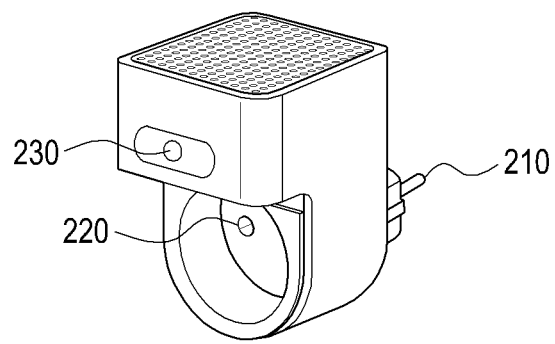
FIG. 2 shows a perspective view of a smart plug according to an embodiment of the present disclosure.

FIG. 2 shows a perspective view of a smart plug according to an embodiment of the present disclosure.

Referring to FIG. 2, an insertion terminal 210 to be inserted into the outlet is provided on the rear of the smart plug, and a binding terminal 220, into which the power cord of the target device is to be inserted, is provided on the front thereof. Besides, a sensor 230 for detecting the user's contact may be installed on the front of the smart plug.

The smart plug should not necessarily be implemented in the shape shown in FIG. 2. In other words, the smart plug may have a variety of applicable shapes by the structure capable of binding the outlet with the power cord of the target device. For example, in FIG. 2, the insertion terminal 210 provided on the rear may be formed on the top, bottom or side, and the binding terminal 220 provided on the front may also be formed on the top, bottom or side.

Figure 3:
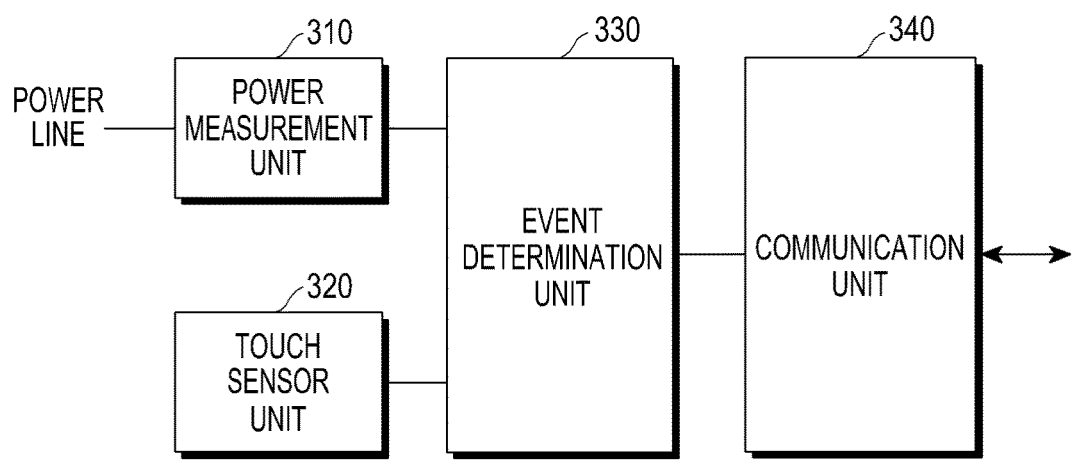
FIG. 3 shows an example of a block configuration of a smart plug according to an embodiment of the present disclosure.

FIG. 3 shows an example of a block configuration of a smart plug according to an embodiment of the present disclosure. FIG. 3 shows a configuration that can be applied in a case where a smart plug, during its installation, sets in advance a target device that the smart plug will monitor.

Referring to FIG. 3, a power measurement unit 310 may measure the amount of power supplied to the target device through a power line. For the amount of power measured by the power measurement unit 310, the amount of power consumption in the target device may be predicted. The power measurement unit 310 may provide information about the measured amount of power or power consumption to an event determination unit 330. The amount of power supplied to the target device may be measured by the power measurement unit 310 at a preset period. The period may be set considering the type and operating characteristics of the target device. The operating characteristics of the target device may include the habits in which the user uses the target device. For example, if the target device is a television, the period in the time zone that the user mainly uses the television may be set shorter compared with the time zone that the user does not mainly use the television.

In one embodiment, the power measurement unit 310 may calculate the amount of power consumption by the supplied current and the supplied voltage. In this case, the power measurement unit 310 should be able to measure the current and voltage supplied to the target device.

The power measurement unit 310 may analyze the characteristics (e.g., the power factor) for the change in power consumption based on the measured amount of power. The power measurement unit 310 may provide the analysis results to the event determination unit 330. The power measurement unit 310 needs to have the ability to process information. In the following description, it will be assumed that information about the amount of power consumption measured by the power measurement unit 310 is provided to the event determination unit 330. However, in the case where the power measurement 310 analyzes the amount of power consumption and provides the analysis results to the event determination unit 330, only the corresponding function may not be handled by the event determination unit 330, thereby enabling easy application thereof.

A touch sensor unit 320 detects a user's touch, and provides the detection results to the event determination unit 330. For example, the user may touch the touch sensor unit 320 for the purpose of the initialization and the function settings of the smart plug.

The event determination unit 330 may configure a power profile by analyzing the amount of power consumption provided from the power measurement unit 310. The event determination unit 330 may set thresholds for the purpose of monitoring the occurrence of an event in the target device. The thresholds may be set using the power profile, or based on the analysis results for the amount of power consumption provided from the power measurement unit 310. The number of thresholds to be set and the setting method may be defined considering the characteristics (e.g., the type, brand, capacity, etc.) of the target device.

Representatively, in a case desired to monitor a refrigerator door open/closed event, a threshold for recognizing a refrigerator door open event and a threshold for recognizing a refrigerator door closed event may be differently set. In addition, the thresholds to be applied may need to be differently set depending on the refrigerator's operation state corresponding to the open or close of the refrigerator door (e.g., whether the compressor is operating or not).

An example of setting thresholds for the purpose of monitoring the occurrence of an event in the event determination unit 330 will be described below with reference to FIGS. 13 and 14.

If the settings for the thresholds are completed, the event determination unit 330 monitors whether a specific event occurs in the target device. The occurrence of a specific event may be monitored based on the analysis result for the amount of power consumption provided by the power measurement unit 310, and the preset thresholds.

For example, when the analysis result for the amount of power consumption provided by the power measurement unit 310 satisfies at least one threshold that is set for detection of a specific event, the event determination unit 330 may determine that the specific event has occurred in the target device.

The event determination unit 330 may collect information about an event occurring in the target device, and manage the collected information through a separate database or report the collected information to the user through a display or a communication unit 340.

The event determination unit 330 includes an operation algorithm for performing the above operation. If the smart plug has been produced only for a specific target device, the event determination unit 330 only needs to include an operation algorithm only for the specific target device. For the smart plug, if a target device can be set by the user's settings, the event determination unit 330 should include an operation algorithm for each of various target devices for all the supportable types, brands and capacities. In addition, even for the same target device, the event determination unit 330 may include an operation algorithm for each target event to be monitored.

The event determination unit 330, when a target device is set by the user, may drive the operation algorithm provided to correspond to the set target device, and monitor the occurrence of an event in the set target device according to the driven operation algorithm. The event determination unit 330 may include an operation algorithm for each event, when there are various events to be detected, for the target device. In this case, when an event to be monitored is set by the user, the event determination unit 330 may drive the operation algorithm provided to correspond to the set event.

The communication unit 340 may perform communication with the external device by interworking with a predetermined network. For example, the communication unit 340 receives information about the type of the target device, which is provided from the external device, provides the received information to the event determination unit 330, and transmits information generated by the event determination unit 330 to the external device.

Figure 4:
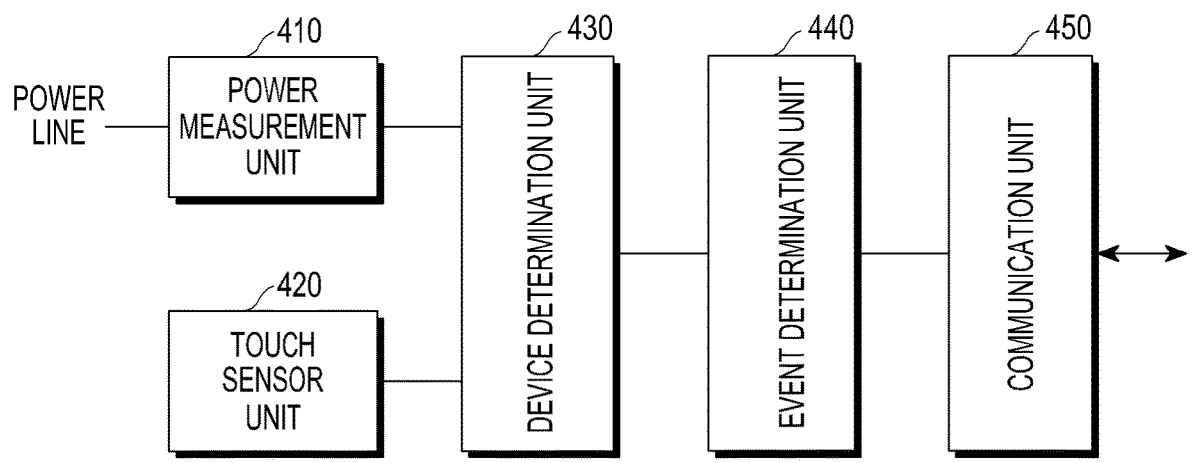
FIG. 4 shows another example of a block configuration of a smart plug according to an embodiment of the present disclosure.

FIG. 4 shows another example of a block configuration of a smart plug according to an embodiment of the present disclosure.

FIG. 4 shows a configuration that can be applied in a case where a smart plug recognizes what the target device is, by analyzing the characteristics of the power consumption measured after its installation. In this case, it is not necessary to install the target device to be monitored, during installation of the smart plug.

To this end, the smart plug shown in FIG. 4 may further include a device determination unit 430 for recognizing a target device, in addition to the components of the smart plug shown in FIG. 3. Other components are the same as the components shown in FIG. 3. Therefore, for the same components as those in FIG. 3, a detailed description thereof will be omitted.

Referring to FIG. 4, the device determination unit 430 may monitor the amount of power consumption measured by a power measurement unit 410 for a predetermined time, and analyze the characteristics of the amount of power consumption to determine the type, brand and capacity of the target device. The device determination unit 430 may include a device recognition algorithm for determining a target device.

Operations performed by other components, in addition to the operation of determining a target device by the device determination unit 430, are the same as those described with reference to FIG. 3.

Figure 5:
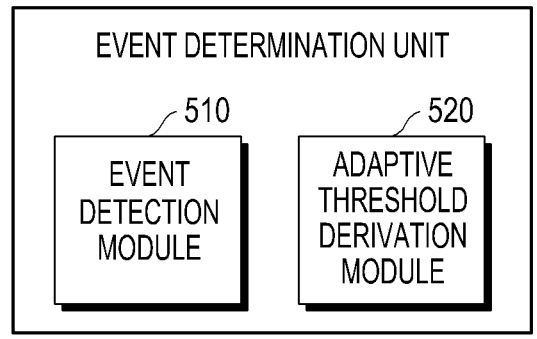
FIG. 5 shows a block configuration of an event determination unit constituting a smart plug according to an embodiment of the present disclosure.

FIG. 5 shows a block configuration of an event determination unit constituting a smart plug according to an embodiment of the present disclosure.

An event determination unit shown in FIG. 5 includes an adaptive threshold derivation module (or adaptive threshold module (ATM)) 520, and an event detection module (or event detect module (EDM)) 510.

The adaptive threshold derivation module 520 sets predetermined thresholds using the result obtained by analyzing the amount of power consumption in the target device or the power profile pre-configured to correspond to the target device. The thresholds are set for the purpose of monitoring the occurrence of an event in the target device. The number of thresholds to be set and the setting method may be defined considering the characteristics (e.g., the type, brand, capacity, etc.) of the target device, and the type of the event.

For example, in a case desired to monitor a refrigerator door open/closed event, a threshold for recognizing a refrigerator door open event and a threshold for recognizing a refrigerator door closed event are set. In addition, the thresholds to be applied may need to be differently set depending on the refrigerator's operation state corresponding to the open or close of the refrigerator door (e.g., whether the compressor is operating or not). The thresholds set by the adaptive threshold derivation module 520 are applied to the event detection module 510.

The event detection module 510 monitors whether a specific event occurs in the target device, based on the thresholds set for the purpose of monitoring an event, and the analysis results for the amount of power consumption in the target device. For example, if the analysis results for the amount of power consumption in the target device satisfy at least one threshold set for the detection of a specific event, the event detection module 510 determines that the specific event has occurred in the target device.

Figure 6:
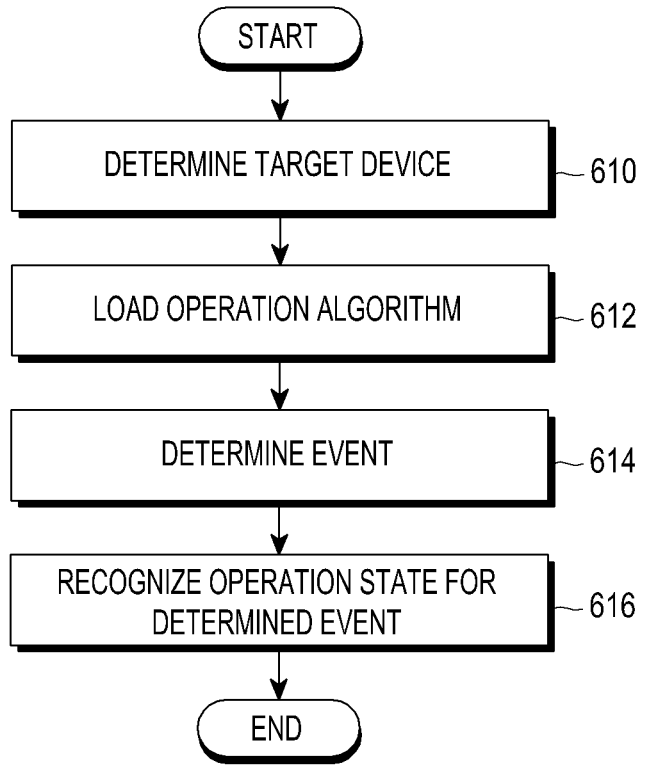
FIG. 6 shows a control flow for recognizing occurrence of an event in a target device by a smart plug according to an embodiment of the present disclosure.

FIG. 6 shows a control flow for recognizing occurrence of an event in a target device by a smart plug according to an embodiment of the present disclosure.

Referring to FIG. 6, the smart plug determines a target device, occurrence of an event in which is to be monitored, in operation 610. For example, the target device may be the legacy appliances such as a refrigerator, a television, a washing machine, a vacuum cleaner.

The smart plug may determine a target device by the operator's settings, or may determine a target device based on the monitoring of the power consumption. For example, the smart plug may continuously monitor the power consumption of the target device for a predetermined time, to determine the target device using the recognized amount of power consumption and the power consumption pattern.

In a case where the smart plug is fixed to support a specific target device only, the smart plug does not necessarily require an operation for determining a target device. In other words, if the smart plug is produced for only one of the legacy appliances such as a refrigerator, a television, a washing machine, a vacuum cleaner, the operation for determining a target device in operation 610 may be omitted during initial installation of the smart plug.

If the smart plug recognizes the settings or determination of the target device or recognizes the target device, the smart plug loads an operation algorithm for monitoring the occurrence of an event in the target device, in operation 612. For example, the way to recognize an event may be different depending on the target device. In other words, for each target device, the change in power consumption detected during the occurrence of an event, and the power factor may be different, and thresholds to be applied to detect the occurrence of an event may also be differently applied. Therefore, in order for the smart plug to monitor the occurrence of an event in various target devices, it is preferable for the smart plug to prepare an operation algorithm for each of all the supportable target devices, and to invoke and use one operation algorithm to be applied, among a plurality of operation algorithms prepared in advance in response to the determination of the target device.

In operation 614, the smart plug monitors which event occurs in the target device, based on the loaded operation algorithm, and determines the event that has occurred, through the monitoring. For example, for the determination of the event, the smart plug sets thresholds, and the determination of the event may be performed based on the set thresholds. An example of a detailed operation thereof is shown n FIG. 7.

Figure 7:
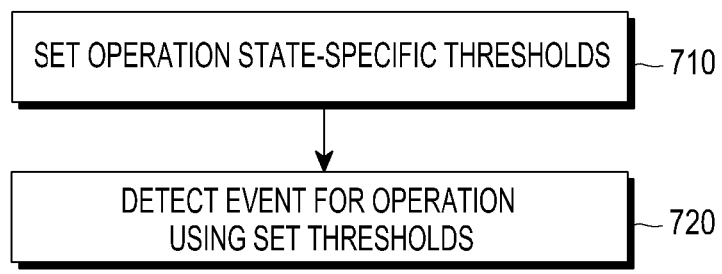
FIG. 7 shows a control flow for determining occurrence of an event in a target device by a smart plug according to an embodiment of the present disclosure.

Referring to FIG. 7, the smart plug sets at least one threshold for each operation state in operation 710. The reason for setting a threshold for each operation state is because even the same event may have a different change in power consumption depending on the operation state that the target device operates in.

For example, in the case of a refrigerator, the power signal characteristics detected when the refrigerator door is open or closed while the compressor is operating may be different from the power signal characteristics detected when the refrigerator door is open or closed while the compressor is not operating. In other words, the power signal has the characteristics representing the stronger noise for the power consumption while the compressor is operating, compared with while the compressor is not operating. Therefore, in order to monitor the occurrence of an event in a target device, the smart plug needs to set a different threshold for each operation state.

The smart plug may set one or more thresholds in response to each of the situation in which a specific operation is being performed in the target device, and the situation in which a specific operation is not being performed in the target device. For example, the smart plug may set a first high threshold and a first low threshold in the situation where a specific operation by the target device is not being performed, and set a second high threshold and a second low threshold in the situation where a specific operation by the target device is being performed.

If the operation state-specific thresholds are set, the smart plug monitors an event occurring in the target device using the set thresholds in operation 720. For example, in order to detect the occurrence of an event in the target device, the smart plug may monitor the consumption pattern of the power supplied to the target device.

By monitoring the change in power consumption, the smart plug may determine the event that has occurred, depending on which one of the preset thresholds is satisfied by the power factor for the power consumption. In other words, the smart plug recognizes the occurrence of a first event, if the power factor for the power consumption exists between the first high threshold and the first low threshold. The smart plug may recognize the occurrence of a second event, if the power factor for the power consumption exists between the second high threshold and the second low threshold. For example, the first event may be a refrigerator door open event, and the second event may be a refrigerator door closed event.

When determining the event that has occurred in the target device, the smart plug may recognize the operation state of the target device corresponding to the determined event in operation 616. The smart plug may consider that the smart plug has recognized the operation state of the target device, by determining the event that has occurred in the target device.

Although not shown in FIG. 6, after determining the occurrence of an event in the target device, the smart plug may provide information thereon to the operator, or provide the information to the external device such as the sever that manages the status of the target device.

Figure 8:
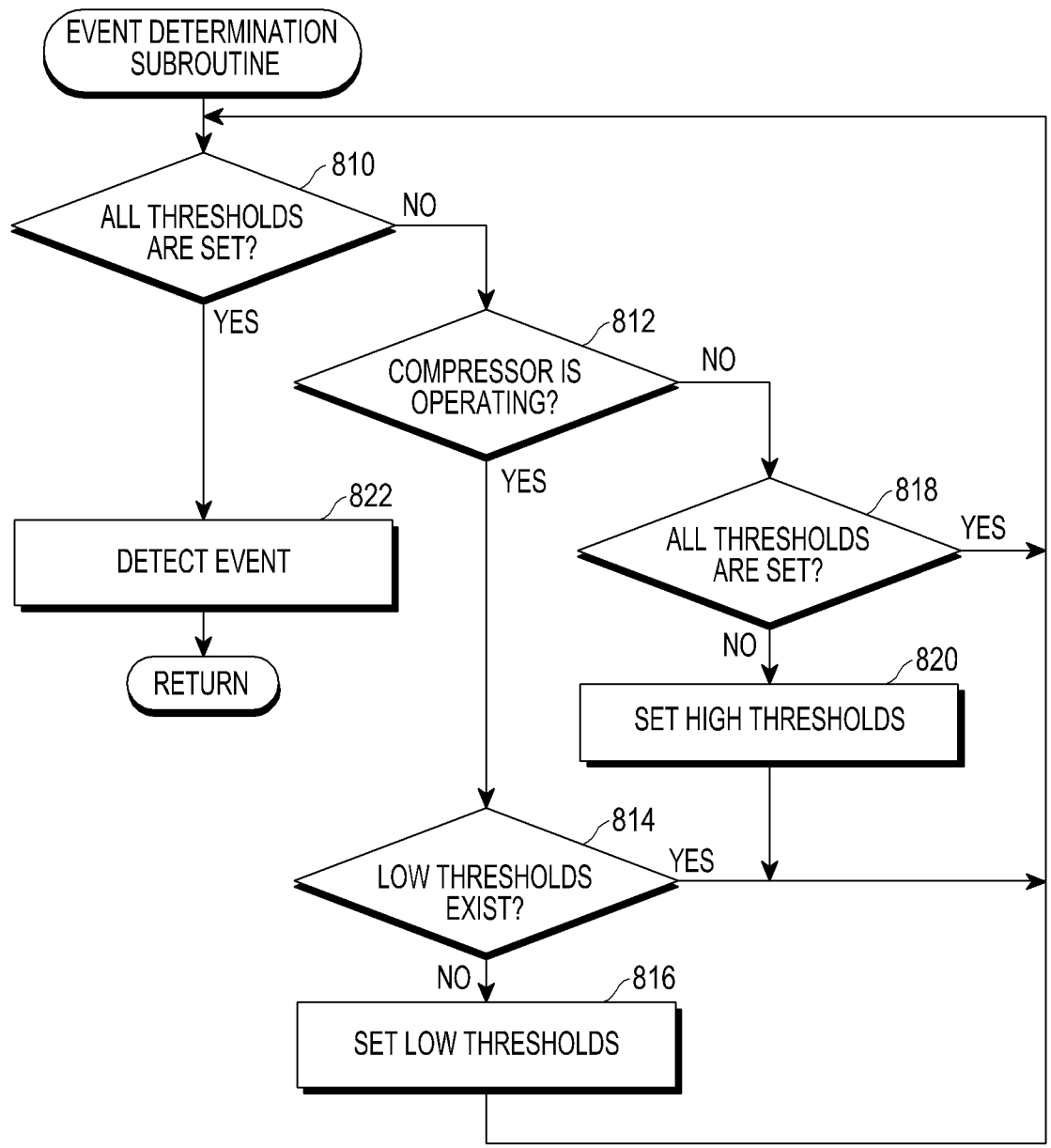
FIG. 8 shows an operation of a subroutine for determining occurrence of an event in a refrigerator by a smart plug according to an embodiment of the present disclosure.

FIG. 8 shows an operation of a subroutine for determining occurrence of an event in a refrigerator by a smart plug according to an embodiment of the present disclosure. In FIG. 8, it is assumed that the smart plug should monitor the occurrence of an event in the refrigerator. Recognizing that the target device is a refrigerator may be performed by the method such as user registration or automatic device recognition (or easy set up).

Referring to FIG. 8, the smart plug may perform the procedure (or the threshold setting procedure (operations 812 to 820)) for setting a plurality of thresholds or the procedure (or the event detection procedure (operation 822) for detecting an event, by the determination result in operation 810.

In one embodiment, the smart plug determines in operation 810 whether all the thresholds to be used to detect the occurrence of an event in the refrigerator are set. The thresholds to be used to detect the occurrence of an event should be defined considering the operation mode of the refrigerator in which an event may occur. A detailed description thereof will be given in the following description.

Figure 12:
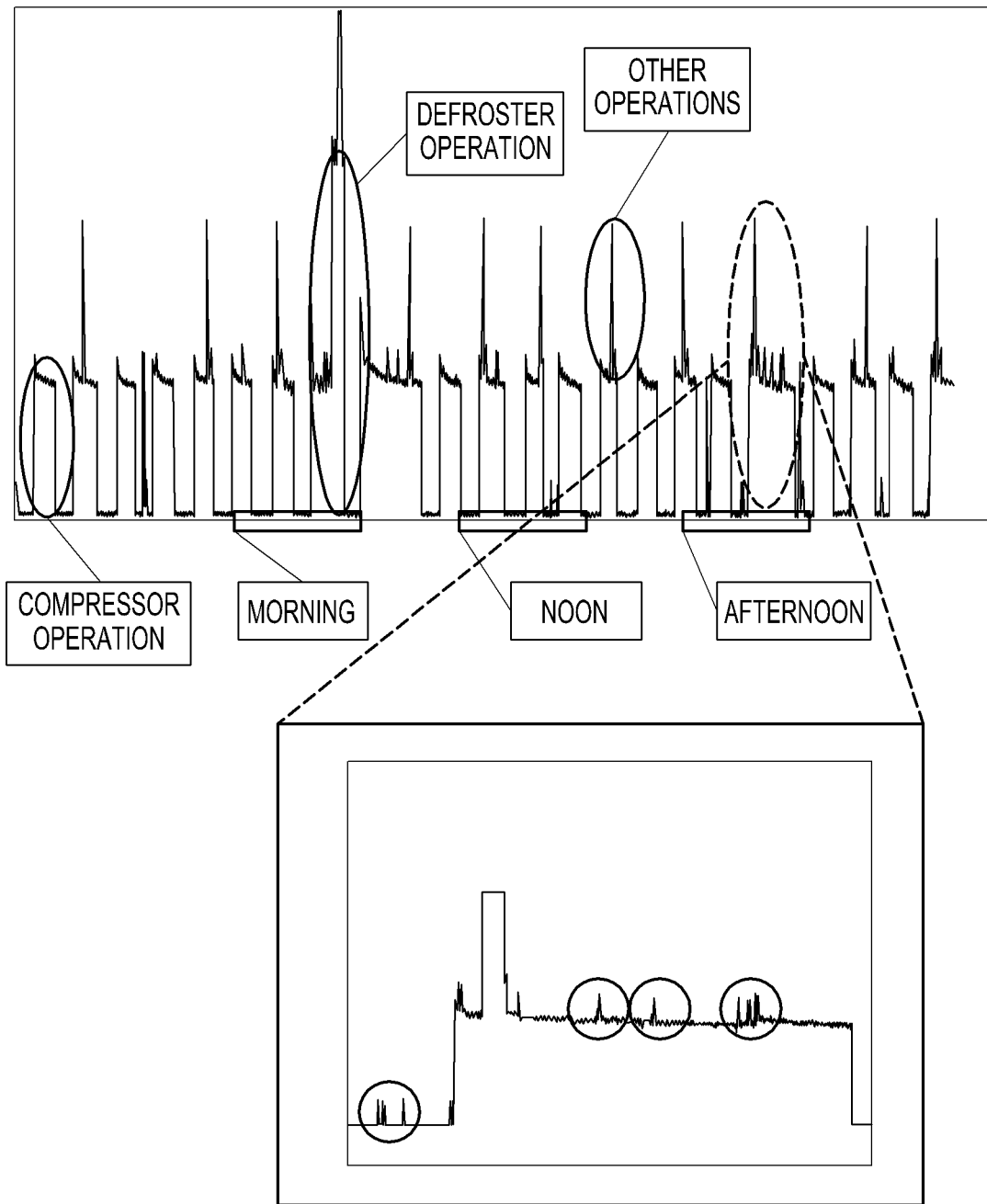
FIG. 12 shows an example of a power profile to be applied for an embodiment of the present disclosure.

For example, the event that can occur in the refrigerator may be identified in an example of the power profile shown in FIG. 12. The power profile shown in FIG. 12 has been prepared by monitoring the power consumption of the refrigerator for 24 hours.

Referring to the power profile shown in FIG. 12, it can be noted that the power consumption in the refrigerator is roughly divided into power consumption by the compressor operation, power consumption by the defroster operation, and power consumption by the other operations. In other words, the operation state in the refrigerator mainly includes the presence/absence of the periodical compressor operation and the presence/absence of the defroster operation. Aside from that, the power profile of the refrigerator may vary depending on the type of the refrigerator that is classified into the inverter type refrigerator, constant speed-type refrigerator, and the linear-type refrigerator. FIG. 12 shows a 24-hour operation profile for the constant speed-type refrigerator.

The circled parts in the enlarged graph shown at the bottom of FIG. 12 represent the power signal characteristics in the case where a door open event has occurred. Since it is general that the interior lights are turned on as soon as the refrigerator's door is open, a change in the power consumption occurs. The fact to be noted here is that the size or type of the lights may vary depending on the type and capacity of the refrigerator, causing a change (10 to 80 W) in the power consumption.

For example, assuming that the noise is 20 W when the compressor is operating in the refrigerator where the change in the lighting power is 80 W, it is possible to design a smart plug so as to determine the event, taking this into consideration. In this case, in the refrigerator where the change in the lighting power is 10 W, it may be difficult to detect the change of 10 W in the lighting power due to the noise.

In this way, it is not easy to determine an event whose power change is fine. Therefore, the smart plug should derive a reference value for determining the occurrence/non-occurrence of a door open event and a door closed event of the refrigerator installed in the home. For example, in order to determine the door open event, a total of two thresholds (e.g., the positive high threshold (or the first high threshold) and the positive low threshold (or the first low threshold)) are required, and in order to determined the door closed event, a total of two thresholds (e.g., the negative high threshold (or the second high threshold) and the negative low threshold (or the second low threshold)) are required.

In order to set the threshold that has not been set, the smart plug determines in operation 812 whether the compressor is operating. The smart plug may determine whether the compressor of the refrigerator is operating or not, based on the power consumption of the refrigerator. The reason is because the refrigerator has a big difference in the amount of power that is consumed when the compressor is operating, and when the compressor is not operating.

When the compressor is not operating, the smart plug determines in operation 818 whether the reason that all the thresholds have not been set is because the high threshold has not been set. In other words, the smart plug determines the presence/absence of the settings of all the high thresholds (e.g., the positive high threshold (or the first high threshold) and the negative high threshold (or the second high threshold)) for detecting an event. When the settings of all the high thresholds do not exist, the smart plug sets the high thresholds that do not exist, in operation 820.

When the compressor is operating, the smart plug determines in operation 814 whether the reason that all the thresholds have not been set is because the low threshold has not been set. In other words, the smart plug determines the presence/absence of the settings of all the low thresholds (e.g., the positive low threshold (or the first low threshold) and the negative low threshold (or the second low threshold)) for detecting an event. When the settings of all the low thresholds do not exist, the smart plug sets the low thresholds that do not exist, in operation 816.

Figure 13:
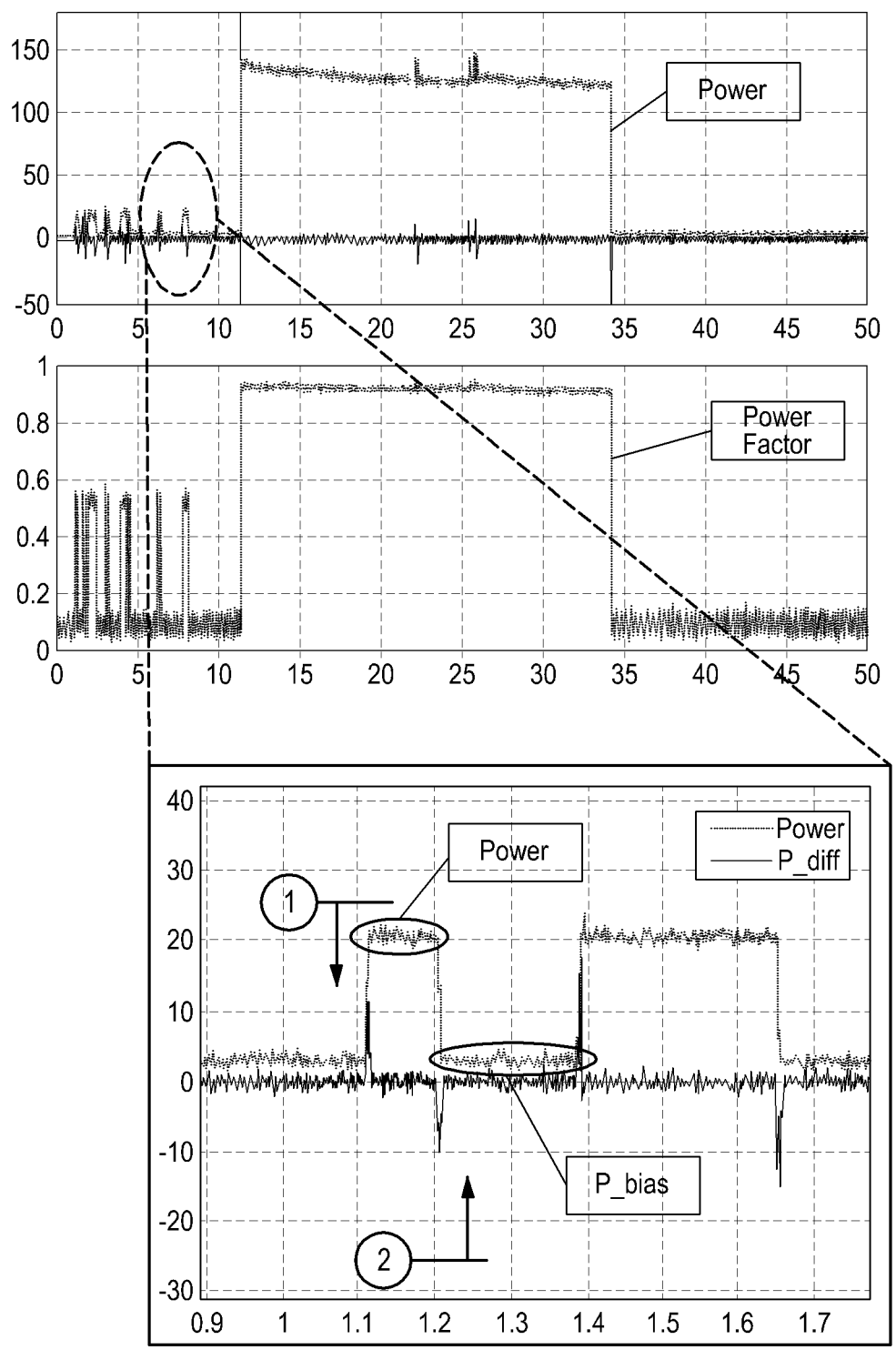
FIG. 13 shows an example of setting a first high threshold and a second high threshold when a compressor is not operating, according to an embodiment of the present disclosure.

FIG. 13 shows an example of setting a first high threshold (a circled number 1) and a second high threshold (a circled number 2) when a compressor is not operating, according to an embodiment of the present disclosure.

In FIG. 13, the first graph is a graph (hereinafter, referred to as a "first real power graph") showing a change in the real power over the time, and the second graph is a graph (hereinafter, referred to as a "first power factor graph") showing a change in the power factor over the time.

Figure 14:
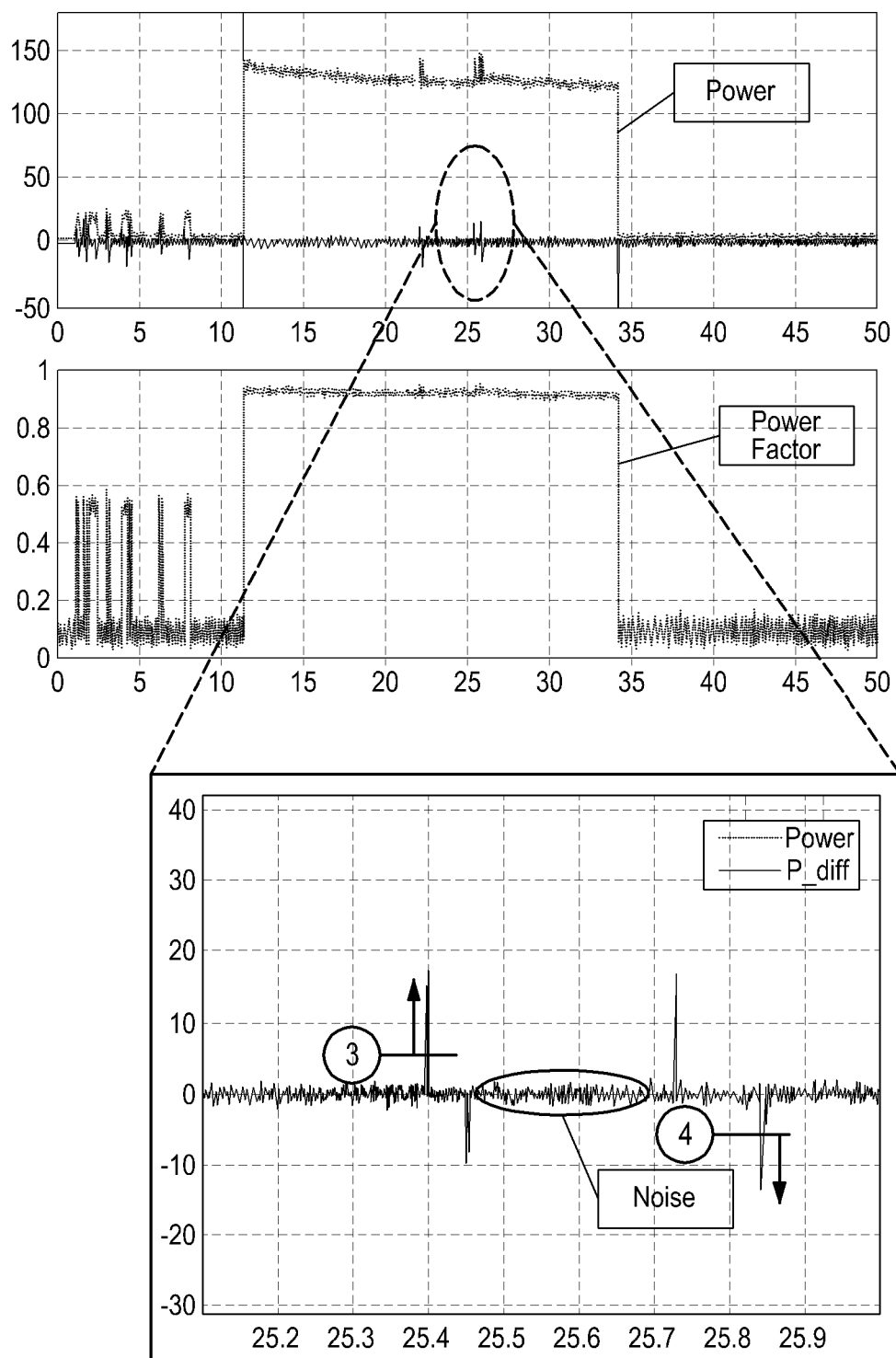
FIG. 14 shows an example of setting a first low threshold and a second low threshold when a compressor is operating, according to an embodiment of the present disclosure.

FIG. 14 shows an example of setting a first low threshold (a circled number 3) and a second low threshold (a circled number 4) when a compressor is operating, according to an embodiment of the present disclosure.

In FIG. 14, the first graph is a graph (hereinafter, referred to as a "second real power graph") showing a change in the real power over the time, and the second graph is a graph (hereinafter, referred to as a "second power factor graph") showing a change in the power factor over the time.

Taking a close look at the first and second power factor graphs shown in FIGS. 13 and 14, it is possible to determine the door open event that occurs when the compressor is operating and the door open event that occurs when the compressor is not operating, based on the change in the power factor. The reason is because it could be noted through the experiments that the change in real power is different for each device, but the power factor not only falls within the range of 0 to 1, but also exceeds a minimum of 0.4 during any lighting operation (a compressor non-operation condition).

However, it can be noted that even if the door open event occurs, the power factor is different when the compressor is operating and when the compressor is not operating. This is because the principle of superposition is not applied to the power factor. Therefore, in order to determine the events for the open and close of the refrigerator door, two positive thresholds and two negative thresholds should be set.

Referring to FIG. 13, an operation of setting thresholds when the compressor is not operating will be described. The time, at which the door open event and the door closed event occur, is calculated, based on the change in the power factor when the compressor is not operating. Since the change in real power may vary depending on the case, a positive high threshold ① and a negative high threshold ② are derived by utilizing the difference between the real power P and the bias P_bias of the real power during occurrence of an event.

For example, P_bias may be obtained by an average of the real power for 10 minutes, when the power factor PF is less than 0.4 and the real power P is less than 90 W. The real power is calculated, when the power factor is greater than 0.4 and the real power is less than 90 W for one or more seconds.

After the real power P and the bias P_bias of the real power are calculated as described above, a positive high threshold ① and a negative high threshold 2 are determined by the value that is about 1.5 times the value of (P−P_bias). In other words, the positive high threshold 1 is determined by giving the positive sign to the value that is about 1.5 times the value of (P−P_bias), and the negative high threshold ② is determined by giving the negative sign to the value that is about 1.5 times the value of (P−P_bias).

Referring to FIG. 14, an operation of setting thresholds when the compressor is operating will be described. A lot of noise is generated when the compressor is operating. Therefore, in order to determine the occurrence of an event while the compressor is operating, the positive and negative low thresholds should be set so as to reduce the wrong determination.

The case of FIG. 14 corresponds to the case where a lot of noise is not generated. However, in the case where a lot of noise is generated, a way to obtain the positive low threshold and the negative low threshold may be the same. First, the compressor's operation is determined by the real power, and the noise in the positive zone and the noise in the negative zone are stored for about 10 minutes.

Thereafter, the stored positive noises and negative noises are arranged or classified in the descending order of their absolute values, and then, the maximum value is obtained after removing about 5% of the outlier. Generally, it is known that utilizing the maximum value or the medium value after removing the outlier is most favorable. The outlier may include on-peak by the compressor's operation and the power change due to the door open.

The value corresponding to about 2 times the maximum value among the values except for the above outlier is calculated, and a positive low threshold ③ and a negative low threshold ④ are determined by the calculated value. In other words, the positive low threshold ③ is determined by giving the positive sign to the calculated value, and the negative low threshold ④ is determined by giving the negative sign to the calculated value.

By the above operation, the smart plug may obtain a total of four thresholds consisting of the positive high threshold ①, the negative high threshold ②, the positive low threshold ③, and the negative low threshold ④. The obtained four thresholds are set in the smart plug, to make it possible to determine the occurrence of the event due to the open and close of the refrigerator door.

Meanwhile, as in the embodiment proposed above, a value corresponding to a small change in power is mainly used in determining individual events (detailed operations) of appliances, and this value is relatively high in terms of the dependence on the model and the capacity of a specific device. Given this, an adaptive algorithm is needed in determining all the individual events.

If it is determined that all the thresholds have been set, the smart plug monitors in operation 822 whether a specific event occurs in the refrigerator, using the set thresholds. The smart plug may detect the occurrence of an event in the refrigerator based on the power signal characteristics of the power supplied to the refrigerator and the set thresholds.

For example, the power signal characteristics may be defined using the real power and the power factor. However, it could be noted through the experiments that the change in real power is different for each device, but the power factor not only falls within the range of 0 to 1, but also exceeds a minimum of 0.4 during any lighting operation (a compressor non-operation condition). Therefore, it will be preferable to use the power factor as the power signal characteristics for detecting the occurrence of an event in the refrigerator.

The power factor may be define by the ratio of the reap power [P] to the apparent power [S] in the alternating current (AC) circuit. The reap power [P] and the apparent power [S] are the same in the AC circuit to which only the pure storage is connected. However, if the AC circuit includes a reactance component defined as an inductance and a capacitance, the apparent power is greater than the real power (or effective power) appearing as heat, light, and radio waves. This extra power is reactive power [Q]. Mathematically, the reactive power [Q] is expressed as an imaginary number.

Figure 9:
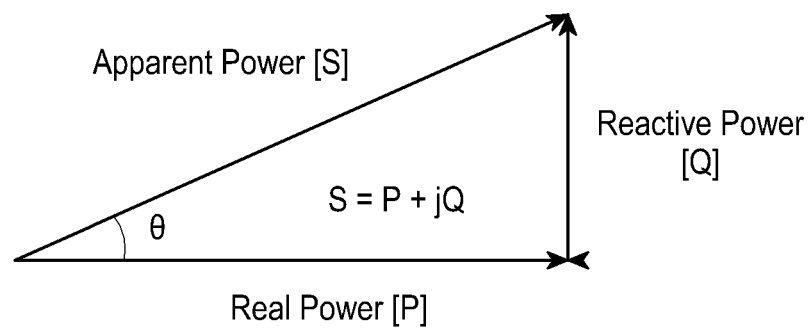
FIG. 9 shows a relationship among real power [P], reactive power [Q] and apparent power [S]

FIG. 9 shows a relationship among real power [P], reactive power [Q] and apparent power [S]. In other words, it has a relationship of "S=P+jQ". Here, an angle Θ between the real power [P] and the apparent power [S] may be regarded as a phase difference between a voltage waveform and a current waveform.

Figure 10:
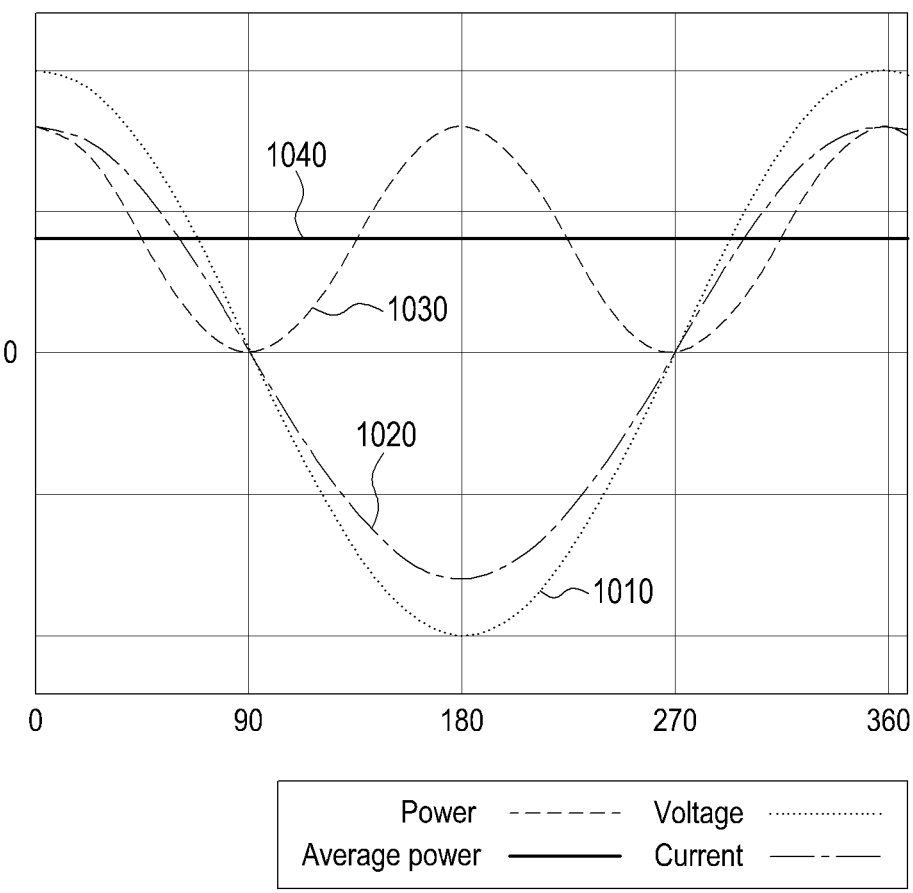
FIG. 10 shows an example in which there is no phase difference between a voltage waveform and a current waveform.
Figure 11:
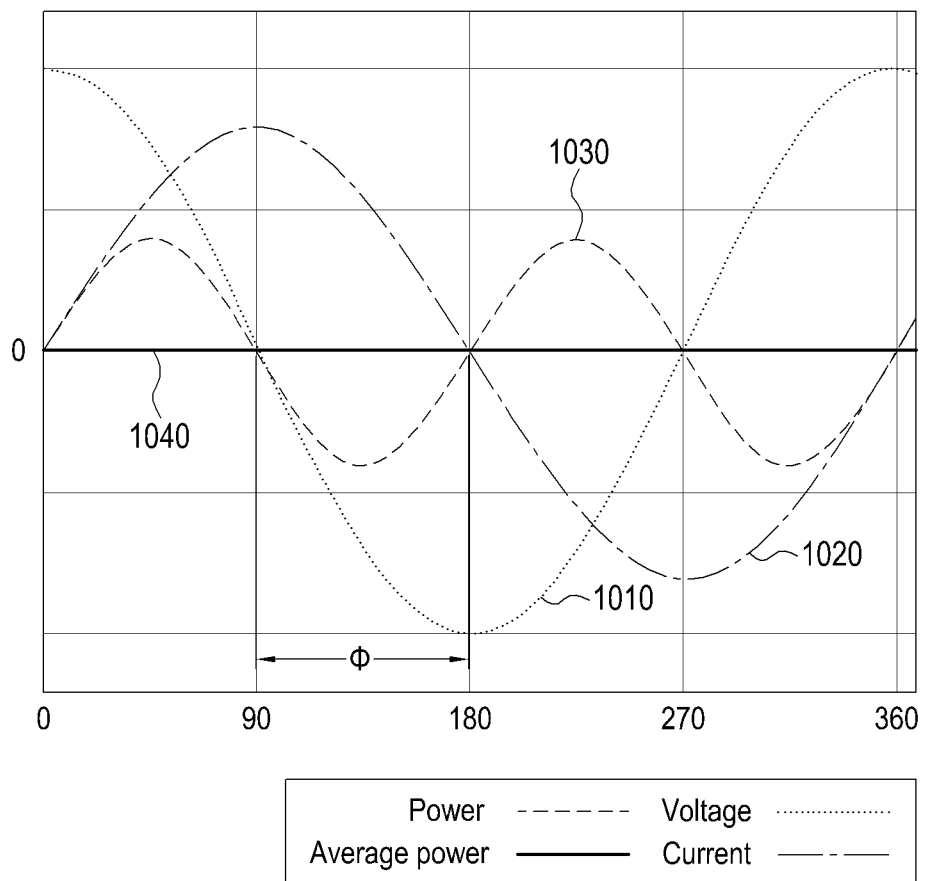
FIG. 11 shows an example in which a phase difference between a voltage waveform and a current waveform is 90°.

FIG. 10 shows an example in which there is no phase difference between a voltage waveform and a current waveform, and FIG. 11 shows an example in which a phase difference between a voltage waveform and a current waveform is 90°.

As shown in FIG. 10, it can be noted that the fact that there is no phase difference between a voltage waveform and a current waveform indicates that the AC circuit is an AC circuit to which only the resistive load is connected. In this case, the power factor is 1. As shown in FIG. 11, in the case where the phase difference between a voltage waveform and a current waveform is 90°, the power factor is 0.

The fact that the power factor is 0 means that the current flows but the average power is 0. The reason why the phase difference of 90° occurs in the voltage waveform and the current waveform is because of the reactance component constituting the AC circuit. For example, if the AC circuit has an inductive reactance component, the current falls behind the voltage by a maximum of 90° (or ¼ cycles). However, if the AC circuit has a capacitive reactance component, the current may have a phase preceding that of voltage by a maximum of 90°.

As described above, it can be noted that since the power factor can be represented as a ratio (cosine theta) of the apparent power to the real power, the range of its value is limited to 0 through 1. This is the value of the range that is given regardless of the power value, and if the power consumption in one device is monitored by like the smart plug, that can be a useful means for detecting a change in the internal state of the device.

For example, in the case of the compressor operation, the defroster operation and the lighting operation during the refrigerator operation, since all the other components are included, the change in power factor is natural when there is a change in the state of the device.

However, in the case of the power factor, the principle of superposition is not applied when the internal components operate at the same time. In other words, since all the reactance components are considered and reflected in the phase difference, they may be obsolete if the correct points are not determined. For this reason, only the power factor given when the refrigerator's compressor and defroster do not operate has been considered in the foregoing description.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A smart plug device installed on a power supply route between a power supply and a target device to detect an event occurring in the target device, the smart plug device comprising:
   a power measurement unit; and
   an event determination unit configured to:
      set at least one high threshold and at least one low threshold based on whether the target device is operating in a specific operation mode,
      obtain a power supplied to the target device via the power measurement unit,
      identify a power signal characteristic indicating a change characteristic of the power that is caused by an occurrence of the event based on the power before the event occurs in the target device, and
      identify the occurrence or non-occurrence of the event in the target device based on whether the power signal characteristic satisfies at least one of the set at least one high threshold or the set at least one low threshold.

2. The smart plug device of claim 1, wherein the power signal characteristic represents a power factor defining a ratio of real power to apparent power in an alternating current circuit.

3. The smart plug device of claim 1, wherein the power signal characteristic represents a power factor corresponding to a phase difference between a voltage waveform and a current waveform of the power that is measured by the power measurement unit.

4. The smart plug device of claim 3, wherein the event determination unit is further configured to:
   set at least one high threshold and at least one low threshold based on whether the target device is operating in the specific operation mode, and
   identify the occurrence or non-occurrence of the event in the target device depending on whether the power signal characteristic satisfies at least one of the set at least one high threshold or the set at least one low threshold.

5. The smart plug device of claim 1, wherein the event determination unit comprises:
   an adaptive threshold derivation module configured to:
      set one high threshold and one low threshold by collecting a noise value included in the power that is measured by the power measurement unit when the target device is operating in the specific operation mode, and
      set one high threshold and one low threshold using a power factor, real power, and a bias value for the power that is measured by the power measurement unit when the target device is not operating in the specific operation mode; and
   an event detection module configured to:
      compare a power factor value corresponding to the power signal characteristic with two high thresholds and two low thresholds set by the adaptive threshold derivation module, and
      identify the occurrence or non-occurrence of the event in the target device based on a result of the comparison.

6. The smart plug device of claim 5, wherein, when the specific operation mode comprises an operation mode in which a compressor is operating in a refrigerator, the two high thresholds are set to predict an occurrence of a refrigerator door open event, and the two low thresholds are set to predict an occurrence of a refrigerator door closed event.

7. The smart plug device of claim 6, wherein the event detection module is further configured to:
   identify the occurrence of the refrigerator door open event when the power factor value corresponding to the power signal characteristic is within a range formed by the two high thresholds, and
   identify the occurrence of the refrigerator door closed event when the power factor value corresponding to the power signal characteristic is within a range formed by the two low thresholds.

8. The smart plug device of claim 1, further comprising:
   a determiner determination unit configured to determine a type, a brand, and a capacity of the target device,
   wherein the event occurring in the target device is determined based on the type of the target device.

9. The smart plug device of claim 1, wherein the at least one high threshold and the at least one low threshold are set based on characteristics of the target device and a type of the event.

10. A method for detecting an event occurring in a target device by a smart plug device installed on a power supply route between a power supply and the target device, the method comprising:
    setting at least one high threshold and at least one low threshold based on whether the target device is operating in a specific operation mode;
    obtaining a power supplied to the target device via a power measurement unit of the smart plug device;
    identifying a power signal characteristic indicating a change characteristic of the power caused by an occurrence of the event based on the power before the event occurs in the target device; and
    identifying the occurrence or non-occurrence of the event in the target device depending on whether the power signal characteristic satisfies at least one of the set at least one high threshold or the set at least one low threshold.

11. The method of claim 10, wherein the power signal characteristic represents a power factor defining a ratio of real power to apparent power in an alternating current circuit.

12. The method of claim 10, wherein the power signal characteristic represents a power factor corresponding to a phase difference between a voltage waveform and a current waveform of the power.

13. The method of claim 12, wherein the identifying of the event comprises:
    setting at least one high threshold and at least one low threshold based on whether the target device is operating in the specific operation mode; and
    identifying the occurrence or non-occurrence of the event in the target device depending on whether the power signal characteristic satisfies at least one of the set at least one high threshold or the set at least one low threshold.

14. The method of claim 10, wherein the setting comprises:
    setting one high threshold and one low threshold by collecting a noise value included in the power when the target device is operating in the specific operation mode; and setting one high threshold and one low threshold using a power factor, real power, and a bias value for the power when the target device is not operating in the specific operation mode.

15. The method of claim 14, wherein the identifying of the occurrence or non-occurrence of the event comprises:
comparing a power factor value corresponding to the power signal characteristic with two high thresholds and two low thresholds; and
identifying that the event has occurred in the target device based on a result of the comparison.

16. The method of claim 15, wherein, when the specific operation mode comprises an operation mode in which a compressor is operating in a refrigerator, the two high thresholds are set to predict an occurrence of a refrigerator door open event, and the two low thresholds are set to predict an occurrence of a refrigerator door closed event.

17. The method of claim 16, wherein the identifying of the occurrence or non-occurrence of the event comprises:
identifying the occurrence of the refrigerator door open event when the power factor value corresponding to the power signal characteristic is within a range formed by the two high thresholds; and
identifying the occurrence of the refrigerator door closed event when the power factor value corresponding to the power signal characteristic is within a range formed by the two low thresholds.

18. The method of claim 10, further comprising:
identifying a type, a brand, and a capacity of the target device,
wherein the event occurring in the target device is determined based on the type of the target device.

* * * * *